United States Patent

Chuang et al.

[11] Patent Number: 6,091,339
[45] Date of Patent: Jul. 18, 2000

[54] POSITION DETECTOR FOR A SPIN-DRYING MACHINE USED IN INTEGRATED CIRCUIT FABRICATION

[75] Inventors: Ming-Te Chuang, Hsinchu Hsien; Yu-Shan Lin, Hsinchu; Kun-Feng Lin, Taichung Hsien; Qing-Yong Chen, Hsinchu Hsien, all of Taiwan

[73] Assignees: United Silicon Incorporated; United Microelectronics Corp., both of Taiwan

[21] Appl. No.: 09/328,057

[22] Filed: Jun. 8, 1999

[51] Int. Cl.[7] ................................................. G08B 21/00
[52] U.S. Cl. .................. 340/686.1; 340/673; 340/679; 250/222.1; 250/223 R; 414/331
[58] Field of Search ............................... 340/686.1, 673, 340/679, 689, 686.2; 250/222.1, 223 R; 414/331, 274

[56] References Cited

U.S. PATENT DOCUMENTS

| | | |
|---|---|---|
| 5,225,691 | 7/1993 | Powers et al. ............................ 250/561 |
| 5,850,185 | 12/1998 | Canty ..................................... 340/686.1 |
| 5,917,601 | 6/1999 | Shimazaki et al. ..................... 356/375 |

*Primary Examiner*—Nina Tong
*Attorney, Agent, or Firm*—Martine Penilla & Kim, LLP

[57] ABSTRACT

A position detector is provided for use on a spin-drying machine employed in integrated circuit (IC) fabrication to detect whether the spin-drying machine has shifted in position during operation. If the spin-drying machine is positioned incorrectly, the position detector is capable of stopping the operation of robot arms used to grab and position wafers on the spin-drying machine so that the robot arms will not be damaged or crash into the wafers on the spin-drying machine due to the incorrect positioning of the spin-drying machine. The position detector is designed for use on a spin-drying machine having a spinning unit, a fixed platform surrounding the spinning unit, and at least one robot arm mounted on the fixed unit. The position detector comprises a pair of emitters mounted on the spinning unit and a pair of oppositely arranged receivers on the fixed platform. In the event that the spinning unit has shifted in position, one or both of the paired emitter/receiver units generates an OFF signal indicative of such a condition. In response, a control unit stops the operation of the robot arm, so that the robot arm will not be damaged or crash into the wafers on the spin-drying machine.

12 Claims, 1 Drawing Sheet

POSITION DETECTOR FOR A SPIN-DRYING MACHINE USED IN INTEGRATED CIRCUIT FABRICATION

BACKGROUND OF THE INVENTION

1. Field of the Invention

This invention relates to integrated circuit (IC) fabrication technology, and more particularly, to a position detector for use on a spin-drying machine employed in IC fabrication to detect whether the spin-drying machine has shifted in position during operation. In the event that the spin-drying machine shifts in position during operation, the position detector is capable of stopping operation of robot arms used to move wafers to and from the spin-drying machine so that the robot arms will not be damaged or crash into the wafers on the spin-drying machine.

2. Description of Related Art

One drawback to the foregoing spray/puddle development method, however, is that, during the spin-drying process, the spin-drying machine may shift in position due to its spinning motion. Conventionally, however, the spin-drying machine is unable to detect such a condition, and, as a result, the robot arm may be damaged or crash into the wafers on the spin-drying machine.

SUMMARY OF THE INVENTION

It is therefore an objective of this invention to provide a position detector for a spin-drying machine, which can prevent robot arms from being damaged or crashing into the wafers on the spin-drying machine in the event that the spin-drying machine has shifted in position during operation.

In accordance with the foregoing and other objectives of this invention, a position detector is provided for use on a spin-drying machine.

The position detector of the invention is designed for use on a spin-drying machine having a spinning unit, a fixed platform surrounding the spinning unit, and at least one robot arm mounted on the fixed unit. The position detector of the invention comprises:

(a) a first emitter, mounted on a first side of the spinning unit, for emitting a first beam;

(b) a first receiver mounted on the fixed platform opposite the first emitter, which is capable of generating a first ON signal upon receiving the first beam from the first emitter and a first OFF signal if the first beam from the first emitter is not received, the first beam from the first emitter being unreceivable by the first receiver if the spinning unit has shifted in position in a first direction;

(c) a second emitter, mounted on a second side of the spinning unit, for emitting a second beam, the second side being substantially perpendicular to the first side on which the first emitter is mounted;

(d) a second receiver mounted on the fixed platform opposite the second emitter, which is capable of generating a second ON signal upon receiving the second beam from the second emitter and a second OFF signal if the second beam from the second emitter is not received, the second beam from the second emitter being unreceivable by the second receiver if the spinning unit has shifted in position in a second direction; and (e) a control unit capable of stopping the operation of the robot arm upon the appearance of either the first OFF signal or the second OFF signal.

Alternatively, the positions of the first emitter and the first receiver, and the second emitter and the second receiver, can be changed. Furthermore, the position detector of the invention comprises an alarm means, such as on a computer unit, which is capable of generating a human-perceptible alarm signal to notify the technicians that the spinning unit is positioned incorrectly.

The foregoing position detector of the invention is capable of stopping the operation of the robot arms in the event that the spin-drying machine has shifted in position. Because of the invention, the robot arms will not be damaged or crash into the wafers on the spin-drying machine due to incorrect positioning of the spin-drying machine.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
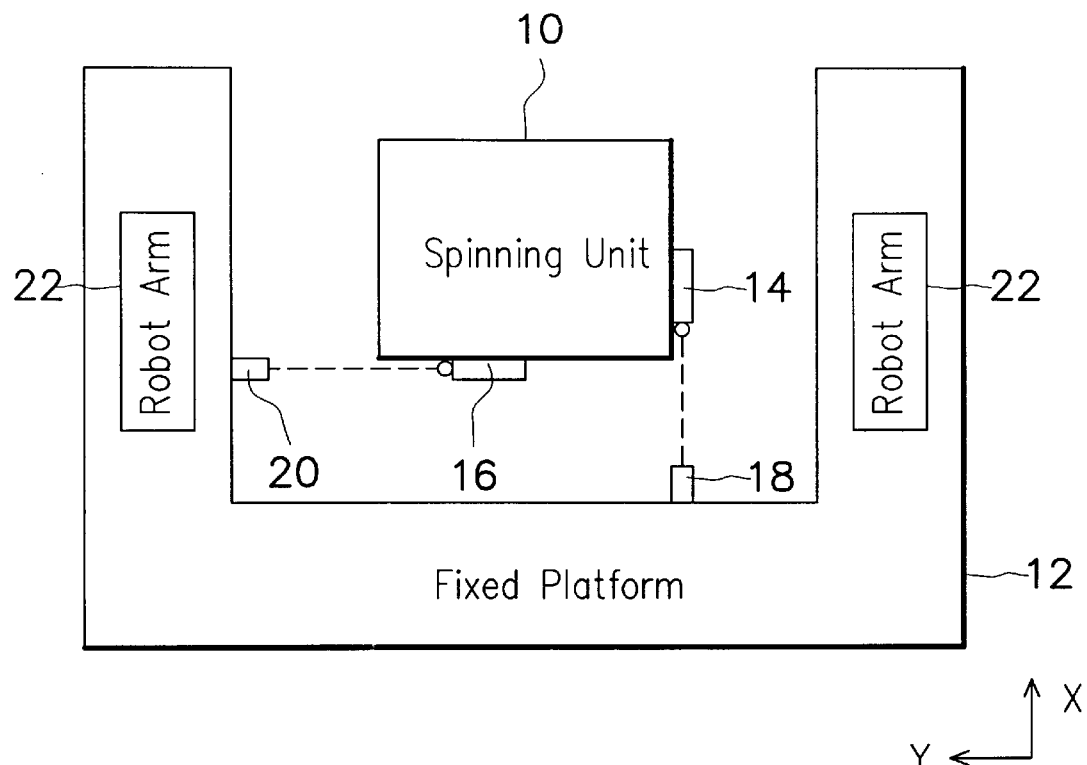
FIG. 1 is a schematic diagram showing a spin-drying machine on which the position detector of the invention is utilized.

FIG. 1 is a schematic diagram showing a spin-drying machine in which the position detector of the invention is utilized.

As shown, the position detector of the invention is designed for a spin-drying machine having a spinning unit (spinner) 10, a fixed platform 12 surrounding the spinning unit 10, and a plurality of robot arms 22 mounted on the fixed platform 12. The position detector of the invention includes a first paired photoelectric sensor unit including a first emitter 14 and a first receiver 18, and a second paired photoelectric sensor unit including a second emitter 16 and a second receiver 20. These paired photoelectric sensor units can be, for example, a through-beam type of photoelectric sensor units.

The first emitter 14 is mounted on one side of the spinning unit 10 and can emit a first light beam in the X-axis direction to the first receiver 18 which is mounted on the fixed platform 12 opposite the first emitter 14. The second emitter 16 is mounted on another side of the spinning unit 10 and can emit a second light beam in the Y-axis direction to the second receiver 20 which is mounted on the fixed platform 12 opposite the second emitter 16.

Alternatively, the positions of the first emitter 14 and the first receiver 18 can be changed, i.e., the first emitter 14 is mounted on the fixed platform 12 while the first receiver 18 is mounted on the spinning unit 10. Similarly, the positions of the second emitter 16 and the second receiver 20 can also be changed, i.e., the second emitter 16 is mounted on the fixed platform 12 while the second receiver 20 is mounted on the spinning unit 10.

The spinning unit 10 is used to spin a set of wafers (not shown) placed thereon. The fixed platform 12 is mounted around the spinning unit 10 and can control the robot arms 22 to move the wafers (not shown) to and from the spinning unit 10. The position detector of the invention is designed to be in active operation when the spinning unit 10 stops spinning.

Figure 2:
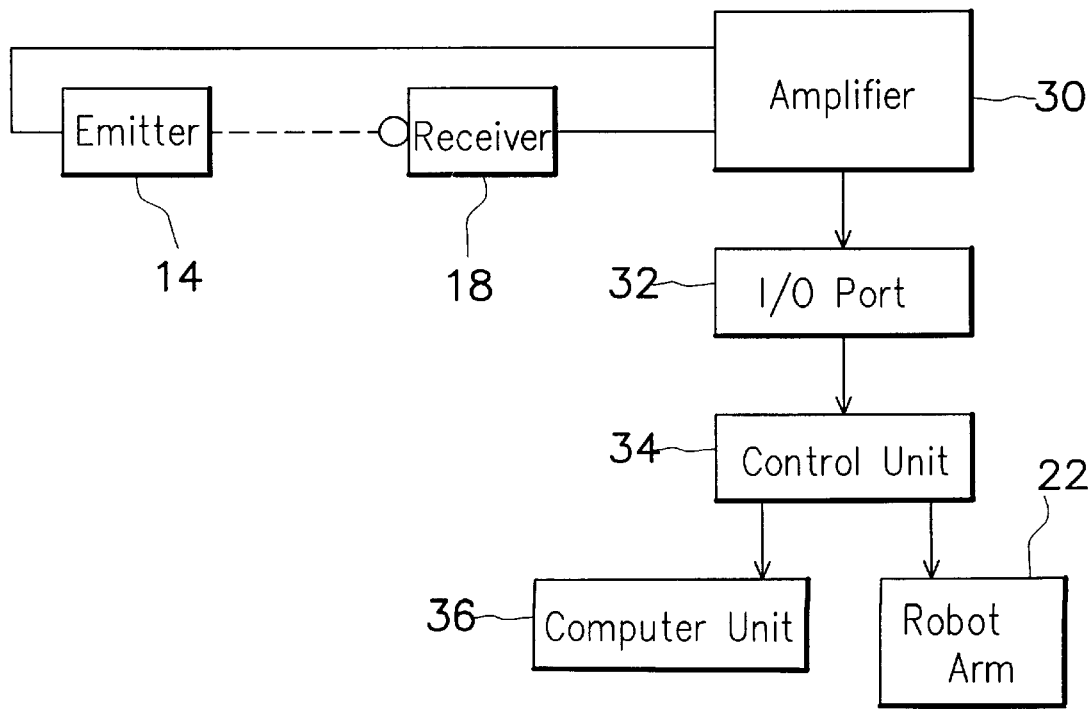
FIG. 2 is a schematic block diagram showing the circuit architecture of the position detector of the invention.

FIG. 2 is a schematic block diagram showing the circuit architecture of the position detector of the invention.

As shown, the position detector of the invention further includes an amplifier 30, an input/output (I/O) port 32, a control unit 34, and a computer unit 36. The emitters 14, 16 and their paired receivers 18, 20 are connected to the amplifier 30.

When the spinning unit 10 (FIG. 1) is stationary, the position detector is activated to detect the position of the spinning unit 10. If the first receiver 18 receives the first light beam from the first emitter 14, it produces a first ON signal, indicating that the spinning unit 10 is positioned correctly in the Y-axis direction. Otherwise, the first receiver 18 produces a first OFF signal, indicating that the spinning unit 10 has shifted in position in the Y-axis direction. In the event that the spinning unit 10 has shifted in position, the propagation axis of the first light beam from the first emitter 14 shifts, so that the first receiver 18 cannot receive the first light beam from the first emitter 14.

The second emitter 16 and the second receiver 20 operate in a similar manner. If the second receiver 20 receives the second light beam from the second emitter 16, it produces a second ON signal, indicating that the spinning unit 10 is positioned correctly in the X-axis direction. Otherwise, the second receiver 20 produces a second OFF signal, indicating that the spinning unit 10 has shifted in position in the X-axis direction. In the event that the spinning unit 10 has shifted in position in the X-axis direction, the propagation axis of the second light beam from the second emitter 16 shifts, and the second receiver 20 cannot receive the second light beam from the second emitter 16.

The output signals from the first receiver 18 and the second receiver 20 are next amplified by the amplifier 30 and then transmitted via the I/O port 32 to the control unit 34. In the case that both of the output signals are ON signals, the robot arms 22 operates normally. Otherwise, in the case that any one of the output signals is an OFF signal, the OFF signal causes the control unit 34 to stop operation of the robot arms 22. This prevents the robot arms 22 from being damaged or crashing into the wafers (not shown) on the spinning unit 10 due to the incorrect position of the spinning unit 10. In addition, the control unit 34 causes the computer unit 36 to generate a human-perceptible alarm signal so as to notify the technician of such a condition.

In conclusion, the invention provides a position detector for use on a spin-drying machine with robot arms for the purpose of stopping operation of the robot arms in the event that the spin-drying machine has shifted in position. The invention prevents the robot arms from being damaged or crashing into the wafers on the spin-drying machine due to the incorrect positioning of the spin-drying machine.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A position detector for use on a spin-drying machine having a spinning unit, with a fixed platform surrounding the spinning unit and at least one robot arm mounted on the fixed unit, the position detector comprising:

a first emitter, mounted on a first side of the spinning unit, for emitting a first beam;

a first receiver mounted on the fixed platform opposite the first emitter, which first receiver is capable of generating a first ON signal if receiving the first beam from the first emitter and a first OFF signal if the first beam from the first emitter is not received, the first beam from the first emitter being unreceivable by the first receiver if the spinning unit shifts in position in a first direction;

a second emitter, mounted on a second side of the spinning unit, for emitting a second beam, the second side being substantially perpendicular to the first side on which the first emitter is mounted;

a second receiver mounted on the fixed platform opposite the second emitter, which second receiver is capable of generating a second ON signal if receiving the second beam from the second emitter and a second OFF signal if the second beam from the second emitter is not received, the second beam from the second emitter being unreceivable by the second receiver if the spinning unit shifts in position in a second direction; and a control unit capable of stopping operation of the robot arm upon the appearance of either the first OFF signal or the second OFF signal.

2. The position detector of claim 1, further comprising:

an alarm means coupled to the control unit, which alarm means is capable of generating a human-perceptible alarm signal as notification that the spinning unit is positioned incorrectly.

3. The position detector of claim 1, wherein the first emitter and the first receiver are a paired photoelectric sensor unit.

4. The position detector of claim 1, wherein the second emitter and the second receiver are a paired photoelectric sensor unit.

5. The position detector of claim 3, wherein the paired photoelectric sensor unit is a through-beam type.

6. The position detector of claim 4, wherein the paired photoelectric sensor unit is through-beam type.

7. A position detector for use on a spin-drying machine having a spinning unit, a fixed platform surrounding the spinning unit, and at least one robot arm mounted on the fixed unit, the position detector comprising:

a first emitter, mounted on a first position on the fixed platform, for emitting a first beam;

a first receiver mounted on a first side of the spinning unit opposite the first emitter, which is capable of generating a first ON signal if receiving the first beam from the first emitter and a first OFF signal if the first beam from the first emitter is not received, the first beam from the first emitter being unreceivable by the first receiver if the spinning unit shifts in position in a first direction;

a second emitter, mounted on a second position on the fixed platform, for emitting a second beam;

a second receiver mounted on a second side of the spinning unit opposite the second emitter, with the second side being substantially perpendicular to the first side on which the first emitter is mounted, the second receiver being capable of generating a second ON signal if receiving the second beam from the second emitter and a second OFF signal if the second beam from the second emitter is not received, the second beam from the second emitter being unreceivable by the second receiver if the spinning unit shifts in position in a second direction; and a control unit capable of stopping the operation of the robot arm upon the appearance of either the first OFF signal or the second OFF signal.

8. The position detector of claim 7, further comprising:

an alarm means coupled to the control unit, which alarm means is capable of generating a human-perceptible alarm signal as notification that the spinning unit is positioned incorrectly.

9. The position detector of claim 7, wherein the first emitter and the first receiver are a paired photoelectric sensor unit.

10. The position detector of claim 7, wherein the second emitter and the second receiver are a paired photoelectric sensor unit.

11. The position detector of claim 9, wherein the paired photoelectric sensor unit is a through-beam type.

12. The position detector of claim 10, wherein the paired photoelectric sensor unit is a through-beam type.

* * * * *